United States Patent
Hodges et al.

(10) Patent No.: US 10,062,352 B2
(45) Date of Patent: Aug. 28, 2018

(54) REDUNDANCY IN A DISPLAY COMPRISING AUTONOMOUS PIXELS

(71) Applicant: Microsoft Technology Licensing, LLC, Redmond, WA (US)

(72) Inventors: Stephen Edward Hodges, Cambridge (GB); Nicholas Yen-Cherng Chen, Cambridge (GB); David Sweeney, Cambridge (GB); Tobias Grosse-Puppendahl, Cambridge (GB)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/257,876

(22) Filed: Sep. 6, 2016

(65) Prior Publication Data
US 2017/0352321 A1 Dec. 7, 2017

(30) Foreign Application Priority Data

Jun. 6, 2016 (GB) .................................. 1609878.2

(51) Int. Cl.
*G09G 3/38* (2006.01)
*G09G 3/02* (2006.01)
(Continued)

(52) U.S. Cl.
CPC .................. *G09G 3/38* (2013.01); *G09G 3/02* (2013.01); *G09G 3/2085* (2013.01);
(Continued)

(58) Field of Classification Search
CPC ........... G09G 2370/16; G09G 2370/18; G09G 2380/02; G06F 2203/04102; H01L 2251/5338; H01L 51/0097
See application file for complete search history.

(56) References Cited

U.S. PATENT DOCUMENTS 4,689,494 A * 8/1987 Chen ..................... G11C 29/80
326/13
5,084,873 A * 1/1992 Houston .................. G11C 8/20
250/370.07
(Continued)

FOREIGN PATENT DOCUMENTS

KR 20150057661 A 5/2015
WO 2008108920 A1 9/2008

OTHER PUBLICATIONS

Sweeney, et al., "Disruptive Displays", Published on: Sep. 7, 2015, 5 pages, Available at: https://hxd.research.microsoft.com/work/disruptive-displays.php.
(Continued)

*Primary Examiner* — Benjamin C Lee
*Assistant Examiner* — Dong Hui Liang

(57) ABSTRACT

A display comprises a plurality of autonomous pixels on a substrate. Each autonomous pixel comprises a display element, a sensing element and a control element. The sensing element is arranged to detect an external stimulus and the control element is arranged to generate, entirely within the autonomous pixel, a control signal to drive the display element based, at least in part, on a magnitude of the external stimulus detected by the sensing element. Additionally, the control element comprises one or more groups of transistors, each group comprising two or more transistors arranged to perform the same function and connected in parallel with each other.

20 Claims, 10 Drawing Sheets

(51) Int. Cl.
  *G09G 3/20* (2006.01)
  *H01L 51/00* (2006.01)
  *H01L 27/12* (2006.01)
  *H01L 27/32* (2006.01)

(52) U.S. Cl.
  CPC ...... *H01L 27/1251* (2013.01); *H01L 27/3255* (2013.01); *H01L 51/0097* (2013.01); *G09G 2300/0439* (2013.01); *G09G 2300/0819* (2013.01); *G09G 2310/04* (2013.01); *G09G 2320/0252* (2013.01); *G09G 2320/0693* (2013.01); *G09G 2330/08* (2013.01); *G09G 2340/16* (2013.01); *G09G 2360/142* (2013.01); *G09G 2360/16* (2013.01); *G09G 2370/18* (2013.01); *G09G 2380/02* (2013.01)

(56) References Cited

U.S. PATENT DOCUMENTS

| | | |
|---|---|---|
| 6,501,448 B1 | 12/2002 | Komiya et al. |
| 7,057,583 B2 | 6/2006 | Koll et al. |
| 7,068,261 B2 | 6/2006 | Kubo et al. |
| 7,679,816 B2 | 3/2010 | Ando et al. |
| 7,688,394 B2 | 3/2010 | Yasui et al. |
| 7,830,587 B2 | 11/2010 | Miles |
| 7,839,365 B2 | 11/2010 | Knapp et al. |
| 9,196,214 B2 | 11/2015 | Nakanishi |
| 9,530,381 B1* | 12/2016 | Bozarth ............ H05B 37/02 |
| 2004/0207590 A1* | 10/2004 | Lu ............ G09G 3/3674 345/93 |
| 2004/0227707 A1 | 11/2004 | Inukai |
| 2006/0044234 A1* | 3/2006 | Shimonishi ............ G09G 5/02 345/77 |
| 2006/0152452 A1 | 7/2006 | Hoppenbrouwers et al. |
| 2007/0018170 A1 | 1/2007 | Jeong et al. |
| 2007/0035490 A1 | 2/2007 | Johnson et al. |
| 2007/0229408 A1* | 10/2007 | Primerano ............ G09G 3/2022 345/76 |
| 2007/0229417 A1 | 10/2007 | Giraldo et al. |
| 2008/0043003 A1 | 2/2008 | Vogsland |
| 2008/0062095 A1 | 3/2008 | Park et al. |
| 2008/0284677 A1* | 11/2008 | Whitehead ............ G09G 3/20 345/1.3 |
| 2009/0146988 A1 | 6/2009 | Johnson et al. |
| 2010/0001933 A1* | 1/2010 | Coker ............ G02F 1/133308 345/83 |
| 2010/0200278 A1 | 8/2010 | Wang et al. |
| 2011/0050658 A1 | 3/2011 | White et al. |
| 2012/0212465 A1 | 8/2012 | White et al. |
| 2014/0132530 A1 | 5/2014 | Suh et al. |
| 2017/0068303 A1* | 3/2017 | Land ............ G06F 1/3265 |

OTHER PUBLICATIONS

"International Search Report and Written Opinion Issued in PCT Application No. PCT/US2017/034903", dated Nov. 30, 2017, 28 Pages.

* cited by examiner

REDUNDANCY IN A DISPLAY COMPRISING AUTONOMOUS PIXELS

BACKGROUND

Current displays use complex electronics, row/column drivers for the pixels and timing circuitry in order to render images on the display. Use of row/column drivers makes it difficult to construct displays on non-developable surfaces (e.g. maintaining a consistent density of pixels throughout the display). A developable surface is one which can be flattened onto a plane without distortion and hence a non-developable surface (such as a spherical surface) is one which cannot be flattened onto a plane without distortion. This is similar to the problem experienced when projecting maps of the globe onto a plane.

SUMMARY

The following presents a simplified summary of the disclosure in order to provide a basic understanding to the reader. This summary is not intended to identify key features or essential features of the claimed subject matter nor is it intended to be used to limit the scope of the claimed subject matter. Its sole purpose is to present a selection of concepts disclosed herein in a simplified form as a prelude to the more detailed description that is presented later.

A display comprises a plurality of autonomous pixels on a substrate. Each autonomous pixel comprises a display element, a sensing element and a control element. The sensing element is arranged to detect an external stimulus and the control element is arranged to generate, entirely within the autonomous pixel, a control signal to drive the display element based, at least in part, on a magnitude of the external stimulus detected by the sensing element. Additionally, the control element comprises one or more groups of transistors, each group comprising two or more transistors arranged to perform the same function and connected in parallel with each other. In various examples the substrate is deformable.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

Figure 1:
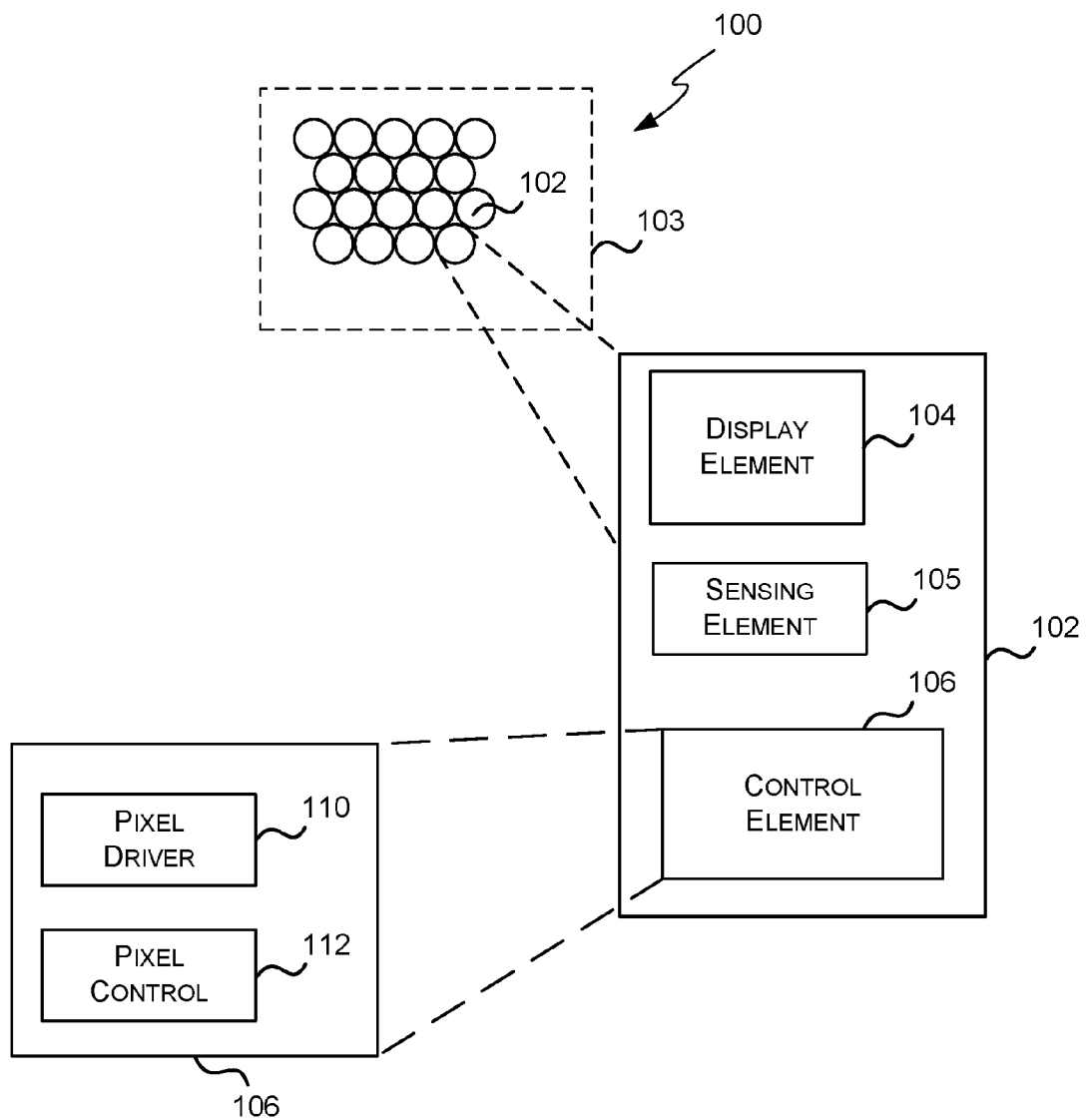
FIG. 1 is a schematic diagram showing a portion of a display comprising a plurality of autonomous pixels.

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

As described above, the use of row/column drivers makes it difficult to construct displays on non-developable surfaces. The use of row/column drivers means that displays typically comprise a regular or rectilinear array of pixels. The embodiments described below are not limited to implementations which solve any or all of the disadvantages of known displays.

Described herein are displays which are formed from a plurality of autonomous, self-contained pixels. In various examples, the autonomous pixels are on and/or in a deformable substrate (i.e. a substrate that can be stretched and/or flexed). Deformation of the substrate may occur during manufacture (e.g. such that the display takes the desired shape or form during manufacture) and/or during operation (e.g. such that display is deformed post-manufacture including at the point when it is assembled into a device and including a scenario where the user deforms the substrate). In other examples, the substrate on which the autonomous pixels are mounted or formed may not be deformable.

The pixels are described as autonomous because they operate independently (i.e. without requiring drive signals from central driver circuitry) and the signals which are used to control each pixel (e.g. to control whether it is black or white or grey or to control the color of the pixel where it is a color or grey-scale display) are generated locally, i.e. entirely within the pixel itself. Within a pixel, the control signal is generated based, at least in part, on the output of a sensor device which senses the magnitude (e.g. level or amplitude) of an external stimulus. The external stimulus may comprise ambient signals incident upon the sensor device and/or an applied signal or stimulus which is applied in the region of the pixel itself. In some of the embodiments described below, the only signals or connections which are provided to the pixels in the display are global signals or connections (i.e. such that the same signals or connections are provided to all the pixels in the display), e.g. a global power connection and a global ground connection.

The circuit within an autonomous pixel that generates the control signal (based, at least in part, on the output of the sensor device) comprises a group of transistors arranged to perform the same function and which are connected in parallel to provide redundancy in the event of failure of one (or more) of the transistors within a group. Each group of transistors comprises two or more transistors and in various examples may comprise three or more transistors or seven or more transistors. In examples where the group of transistors comprises only two transistors, each of the transistors may be large devices that can be laser trimmed if required to unify gain across all pixels. Furthermore, prior to deformation the transistors within a group are oriented in at least two different orientations (e.g. within the plane of the display) and/or spatially separated such that the effect of any deformation on the transistors within a group is not likely to be identical.

In other examples, the sensor device may be replicated (e.g. as described below with reference to FIG. 10) instead of replicating transistors. As with the replicated transistors, the replicated sensor devices perform the same function and are connected in parallel to provide redundancy in the event of failure of one of the sensor devices within a pixel. The two sensor devices are substantially identical (e.g. they detect the same external stimulus and are designed to have the same sensing parameters); however, they may be oriented in two different orientations. As with the transistor examples, a group of sensor devices within a pixel may comprise more than two sensor devices.

Depending upon the deformation experienced by a group of transistors (where this deformation may be the intentional deformation of a deformable substrate or the accidental deformation of a non-deformable substrate), a first transistor within a group which is in a first orientation and/or first location may experience more significant deformation than a second transistor within the group which is in the second orientation and/or second location (where the first and second orientations are different and the first and second locations are spatially separated) and this may cause the first transistor to fail or have degraded performance compared to the second transistor. If the first transistor fails or has degraded performance it does not cause the entire circuit (and hence the autonomous pixel) to fail because of the presence of the second transistor (or other transistors within the group, where the group comprises more than two transistors) but it will change the performance of the autonomous pixel (e.g. by reducing or increasing its sensitivity).

The change in performance as a consequence of the deformation or failure of the first transistor in one or more autonomous pixels may result in variability in performance (e.g. sensitivity) between autonomous pixels within a display (e.g. such that there is a significant difference in the control signals generated in different autonomous pixels in response to the same external stimulus) and this may be addressed using a calibration procedure (where calibration may be performed on manufacture, periodically during use or each time an image is rendered on the display) or by actively selecting which transistor(s) within each group remain operational in an autonomous pixel and disconnecting or disabling the other transistors (e.g. as part of a set-up procedure for the display following the deformation of the display). Transistors may be disconnected using fuses or disabled using a global disable signal. In addition, or instead, as part of a calibration procedure, some of the autonomous pixels may be disabled. The disabling of an autonomous pixel may be implemented using a global disable signal (received via a global electrical connection) and wherein a pixel may be disabled if it detects an external stimulus at the same time as receiving the global disable signal.

Although the change in performance is described herein as being a consequence of deformation of the display, in some examples, the variability in performance may be caused by other factors (e.g. manufacturing variability) and the redundant transistors as described herein may also be used in this scenario (e.g. to increase manufacturing yield).

By constructing a display from autonomous, self-contained pixels, the pixels can be arranged in an arbitrary arrangement and are not limited to a regular or rectilinear grid. For example, the pixels may be randomly (or pseudo-randomly) arranged. This enables displays with a constant pixel density across the display to be formed on non-developable surfaces (e.g. such that the pixel density is independent of the topology in a particular region of the display) and/or for the pixel density to be changed by stretching the display. Additionally, as the pixels operate independently, images can be easily rendered onto the display through the provision of the external stimulus. Where this external stimulus comprises visible light, the display may act as a self-developing photographic surface. Using the autonomous pixels described herein, a display can be implemented with minimal electronic components and this may therefore enable a display to be thinner, deformable, lighter, cheaper and/or easier to manufacture than traditional displays. It can also be fabricated using standard manufacturing techniques.

Any suitable display technology may be used and in many examples, the display may be an electronic paper display. The term 'electronic paper' is used herein to refer to display technologies which reflect light (like paper) instead of emitting light like conventional LCD displays. As they are reflective, electronic paper displays do not require a significant amount of power to maintain an image on the display and so may be described as persistent displays. A multi-stable display is an example of an electronic paper display. In some display devices, an electronic paper display may be used together with light generation in order to enable a user to more easily read the display when ambient light levels are too low (e.g. when it is dark). In such examples, the light generation is used to illuminate the electronic paper display to improve its visibility rather than being part of the image display mechanism and the electronic paper does not require light to be emitted in order to function.

The term 'multi-stable display' is used herein to describe a display which comprises pixels that can move between two or more stable states (e.g. a black state and a white state and/or a series of grey or colored states) and each pixel may therefore be referred to as a 'multi-stable display element' or 'multi-stable pixel'. Bi-stable displays, which comprise pixels having two stable states, are therefore examples of multi-stable displays. A multi-stable display can be updated when powered, but holds a static image when not powered and as a result can display static images for long periods of time with minimal or no external power. Consequently, a multi-stable display may also be referred to as a 'persistent display' or 'persistently stable' display.

FIG. 1 is a schematic diagram showing a part 100 of a display comprising a plurality of autonomous pixels 102 formed in and/or on a substrate 103 which may be deformable. Each autonomous pixel 102 comprises a display element 104, a sensing element 105 and a control element 106. The display element 104 is an element which can be modified by the control element 106 (e.g. to change its color) in order to display visual information. The control element 106 generates a control signal to modify the display element 104 based, at least in part, on the output of the sensing element 105 which senses the magnitude (or level) of an external stimulus. As described above, each pixel 102 operates autonomously and so comprises its own sensing element 105 and control element 106 such that signals to control the display element 104 in a particular pixel 102 (e.g.

to change the state of the display element) are generated entirely within that pixel 102 (and are not generated in centralized control circuitry).

Figure 5:
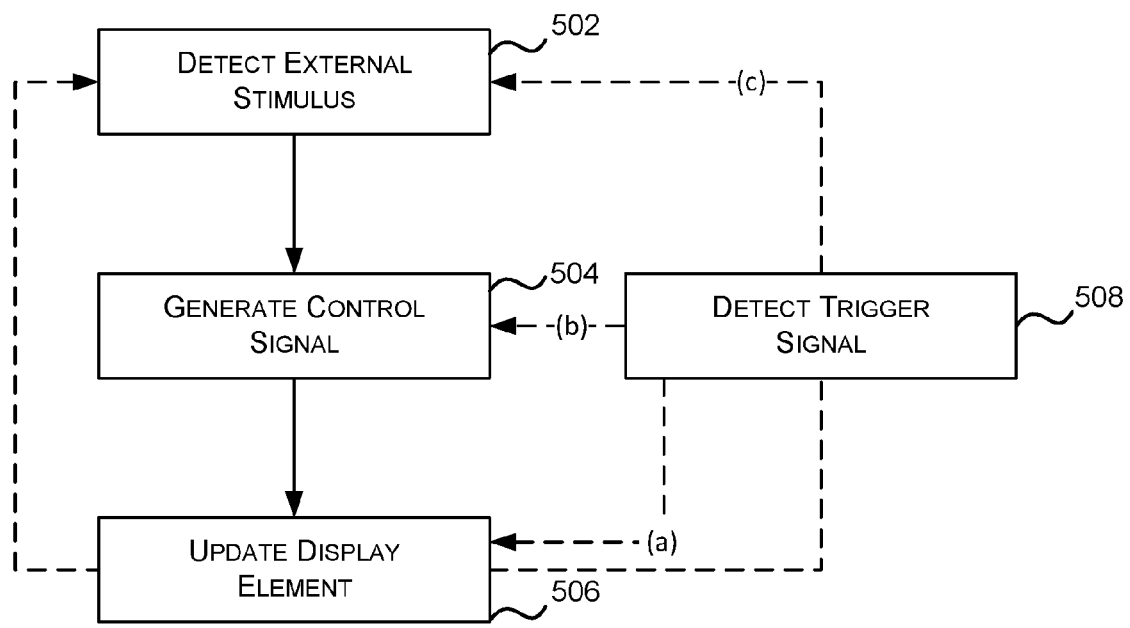
FIG. 5 is a flow diagram showing an example method of operation of an autonomous pixel.
Figure 6:
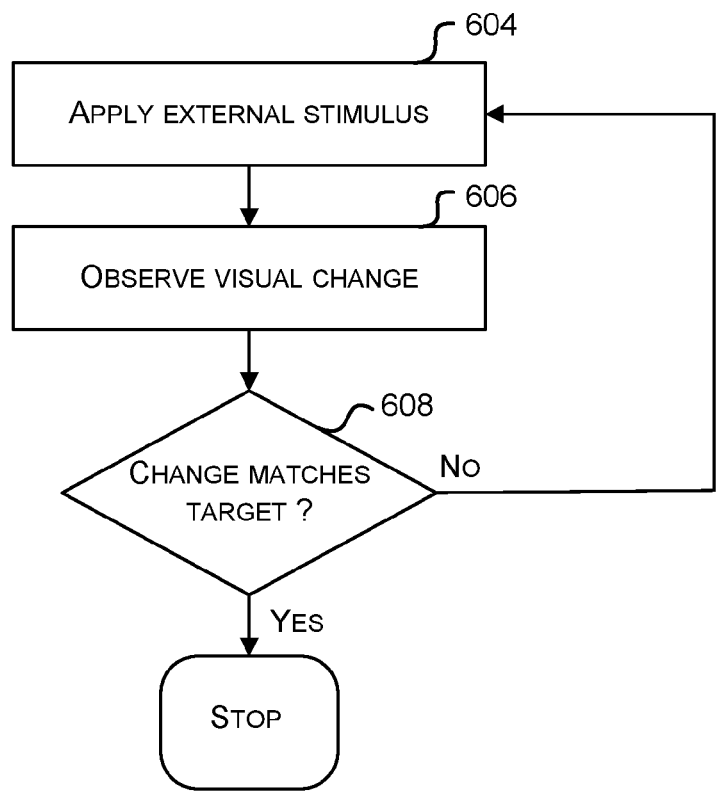
FIG. 6 is a flow diagram of an example method of calibration of a display such as shown in FIG. 1.

In various examples, the display element 104 is an electronic paper display element (e.g. it may be multi-stable) and may, for example, comprise an e-ink (or similar) bead or a portion of an electrophoretic film with suitable electrodes arranged to move the contained pigment particles. Where a multi-stable film or ink is used, the film or ink may extend across many pixels with the display elements being defined by the arrangement of electrodes (e.g. as shown in FIGS. 5-6 and described below). In another example, a multi-stable display element may comprise an electromechanical activated pixel (e.g. a flip-dot or flip-disc). Other electronic paper display technologies may alternatively be used, such as electrochromic or cholesteric liquid crystal displays. As described above, use of multi-stable display elements allows the display to retain an image once the electrical power required to change the image is removed.

In other examples, however, the display element 104 is not multi-stable and so requires a substantially constant power supply in order to be able to maintain its state (and hence in order that the display can continue to display an image). In such examples, the display element 104 may comprise an LED, OLED, electrowetting display or LCD (although it will be appreciated that there may be ways in which these technologies may also be used to provide a multi-stable display element).

The sensing element (or sensor) 105 senses the local environment and in particular the external stimulus and different sensing elements 105 may be used to detect different external stimuli. The external stimulus may comprise ambient signals incident upon the sensing element 105 and/or an applied signal or stimulus which is applied in the region of the pixel itself. In various examples a display (or a pixel 102) may have different operating modes: one where it detects ambient signals and one where it detects an applied signal and the operation of the pixel 102 (e.g. the control element 106) may change between the different modes, for example by using a different threshold in the second mode (that detects an applied signal) or by otherwise removing the background ambient stimulus from the signal in the second mode. In the case of visible light, the sensing element 105 detects the level of incident light upon the pixel 102. The positioning of the sensing element 105 within the pixel (e.g. in relation to the display element 104) may depend on the particular display element and external stimulus used, i.e. whether the display element 104 is opaque to the stimulus being sensed (in which case the display element 104 cannot be between the sensing element 105 and a front surface of the display, i.e. the sensing element 105 cannot be directly behind the display element 104 and may instead be positioned adjacent to the display element) and/or whether the sensing element 105 is opaque to the signal being output by the display element 104 (in which case the sensing element 105 cannot be between the display element 104 and a front surface of the display, i.e. the sensing element 105 cannot be in front of the display element 104 and may instead be positioned adjacent to the display element). The front (or top) surface of the display is used herein to refer to the viewing surface (i.e. the surface on which an image is rendered) and is not intended to limit the possible orientation of the display itself (e.g. in use) which may be horizontal or vertical or at any other orientation and as described herein may be non-planar.

The control element 106 in a pixel is arranged to control the display element 104 (in the same pixel) in response to an external stimulus, i.e. the control element 106 generates a control signal to drive the display element 104 based, at least in part, on the output of the sensing element 105.

The external stimulus may, for example, be visible light (i.e. visible light which is incident upon the display and in particular on the particular pixel 102). In other examples another external stimulus may be used such as other types of radiation (UV, infra-red, X-ray, microwaves, RF, etc., e.g. such that the display may be used to visualize any part of the electromagnetic spectrum), pressure (mechanical, acoustic, vibration, etc.), capacitance, gravity, acceleration, electric and magnetic fields, temperature or chemicals. In all examples, the external stimulus is sensed locally (i.e. within the pixel) and the sensor output is used to control the display element in the pixel. In many of these examples the external stimulus is an analog signal. In some of the examples the external stimulus is not a digital signal which encodes data (e.g. a WiFi™ or IrDA signal) and hence, in these examples, the control element 106 does not generate the control signal based on decoded data from the sensed external stimulus but instead generates the control signal based, at least in part, on the magnitude (e.g. level or amplitude) of the sensed external stimulus. It will be appreciated that some of these external stimuli are not visible (e.g. infra-red) and so enable covert printing or rendering (i.e. other viewers cannot see the image before it is rendered on the display).

As shown in FIG. 1, the control element 106 may functionally be considered as a combination of two different functional elements: a pixel driver 110 and a pixel controller 112. The pixel controller 112 takes input from the sensing element 105 and outputs a local control signal in order to affect the display element 104 in the pixel 102. In various examples, the pixel controller 112 may perform some simple processing of the input signal, such as thresholding, tone mapping, delay effects, signal processing, blending, etc. The pixel driver 110 (which in various examples may be integrated with the pixel controller 112) amplifies the output of the pixel controller 112 and will depend upon the type of technology used for the display element 104. Where the display element 104 is multi-stable, the pixel driver 110 and other elements within the pixel 102 can be powered down once the display element 104 has been updated.

To provide resilience to deformation (i.e. to reduce the probability that an autonomous pixel will fail when the display is deformed), one or more transistors within the control element 106 (e.g. within the amplification circuit within the pixel driver 110) are replicated at least once (e.g. duplicated) and the resulting group of two or more transistors (which are all arranged to perform the same function) are electrically connected in parallel. Furthermore, the transistors within a group are oriented in at least two different orientations (e.g. within the plane of the display, prior to deformation) and/or spatially separated such that the effect of any deformation on the transistors within a group is not likely to be identical. In various examples, where the transistors within a group are oriented in at least two different orientations, they may also be positioned in close proximity to each other (instead of being spatially separated) such that they experience similar deformation when the display is deformed (e.g. stretched and/or flexed); however, the effect on the different transistors in the group will be different because of their different orientations.

Figure 2:
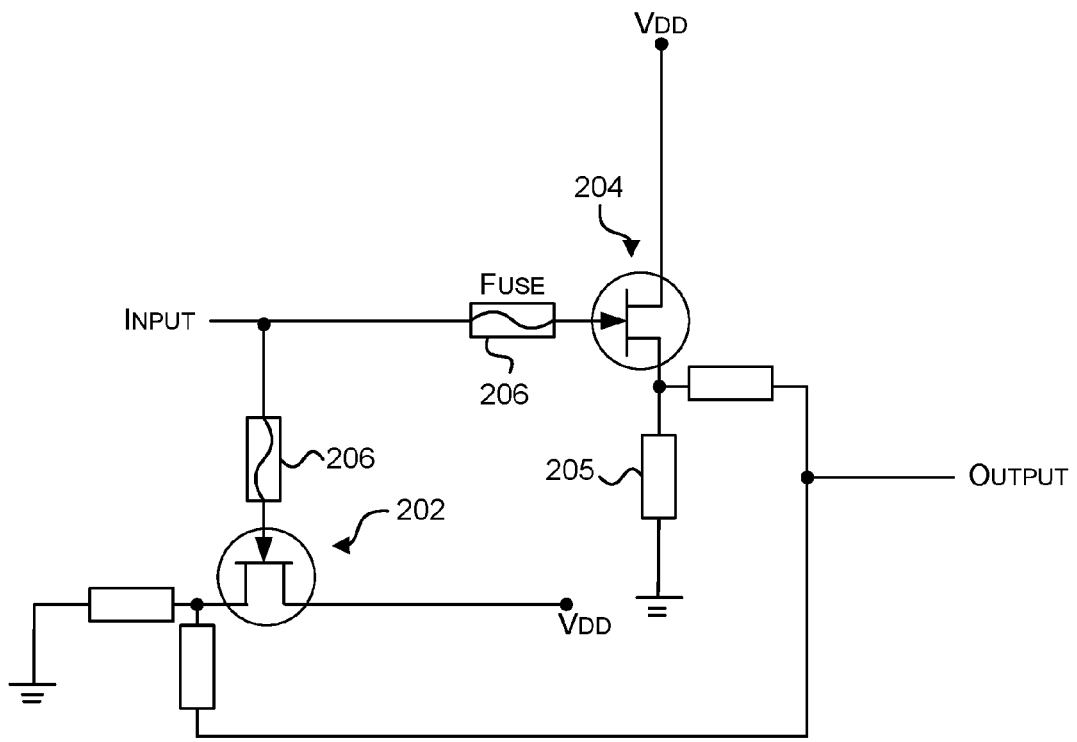
FIG. 2 is an example circuit diagram showing a portion of the control element within an autonomous pixel.

An example portion of a circuit diagram is shown in FIG. 2 which comprises a group of transistors connected in parallel. The transistors may be BJTs or may be FETs (which operate using a geometry sensitive channel and hence their operation is affected by deformation of the channel). In the example shown, the group comprises two transistors: a first transistor 202 and a second transistor 204. This group of transistors may be part of an amplification circuit within the pixel driver 110 or may be another part of the control element 106 and the circuit may additionally comprise a number of resistors 205. In some examples, a combination of resistors which are arranged in different orientations and/or spatially separated may be used to mitigate any effect on the resistors due to deformation of the substrate. As shown in FIG. 2, the orientation of the first and second transistors 202, 204 is different (i.e. the channels of the transistors are oriented differently within a plane of the display prior to deformation).

In the event that one of the transistors 202, 204 fails during deformation, the circuit shown in FIG. 2 will still operate; however where the signals are analog signals, the amplification provided (and hence the sensitivity of the pixel) may change and/or there may be small timing differences introduced. In contrast, where the signals are binary, the parallel connection of the transistors acts in a similar manner to a logic "OR", and if one transistor fails, the other transistor ensures that the circuit continues to function properly.

Any difference in performance between autonomous pixels 102 in a display which results from some pixels 102 having transistors which have failed and other pixels 102 having no transistors that have failed can be removed through calibration and various examples of calibration procedures are described below. Alternatively, where the deformation occurs during manufacture or installation (i.e. the deformation is not the result of a user action and may be permanent), the circuit may also include fuses 206 (as shown in FIG. 2 and which may alternatively be referred to as 'fusable links') which may be selectively blown as can be described with reference to FIG. 3 or instead of fuses, other means for selectively disabling transistors. In other examples, antifuses may be used instead of fuses. As can be seen from FIG. 2, where the optional fuses 206 are included, blowing a fuse has substantially the same effect on the electrical circuit (and hence the operation of the autonomous pixel 102) as the failure of a transistor.

In autonomous pixels 102 which include fuses 206, the performance of each autonomous pixel 102 may be measured (block 304) after the deformation of the display (block 302). If the measured range in performance across all or a subset of the autonomous pixels 102 in a display exceeds a pre-defined limit ('Yes' in block 306), then one or more pixels are selected (block 307), where the selected pixel(s) may be a best performing pixel (e.g. the autonomous pixel with the highest sensitivity) or may be selected at random from a set of best performing pixels (e.g. the autonomous pixels with the highest sensitivity). A fuse in each of the selected autonomous pixel(s) is then blown (block 308), e.g. using a laser, mechanical deformation, light, ultrasound or heat. In various examples, a fuse may be blown electrically (e.g. using an additional global connection to which a high voltage is applied and which, in combination with detection of an external stimulus, causes a fuse to blow). After blowing one or more fuses (in block 308) measurement may then be repeated (as indicated by the arrow from block 308 to block 304) and if the measured range in performance is now within the pre-defined limit ('No' in block 306), then no further fuses are blown. If, however, the performance is still outside of the pre-defined limit ('Yes' in block 306) then a fuse may be blown in one or more of the best performing pixels (as determined from the most recent measurements) and then the method may be repeated until the measured range in performance is within the pre-defined limit or alternatively until other criteria are met (e.g. a maximum number of fuses have been blown).

In a display in which each group of transistors only comprises two transistors (e.g. as shown in FIG. 2), the maximum number of fuses which may be blown (e.g. in one or more instances of block 308) may be equal to the number of pixels in the display multiplied by the number of groups in each pixel (i.e. a maximum of one fuse per group per pixel may be blown to ensure that there is at least one operational transistor remaining in each group of transistors). In other examples, however, where there are groups of pixels with more than two transistors, then more than one fuse can be blown in the group if necessary to even out the performance across autonomous pixels, whilst still ensuring that there is at least one operational transistor remaining in every group of transistors.

Figure 3:
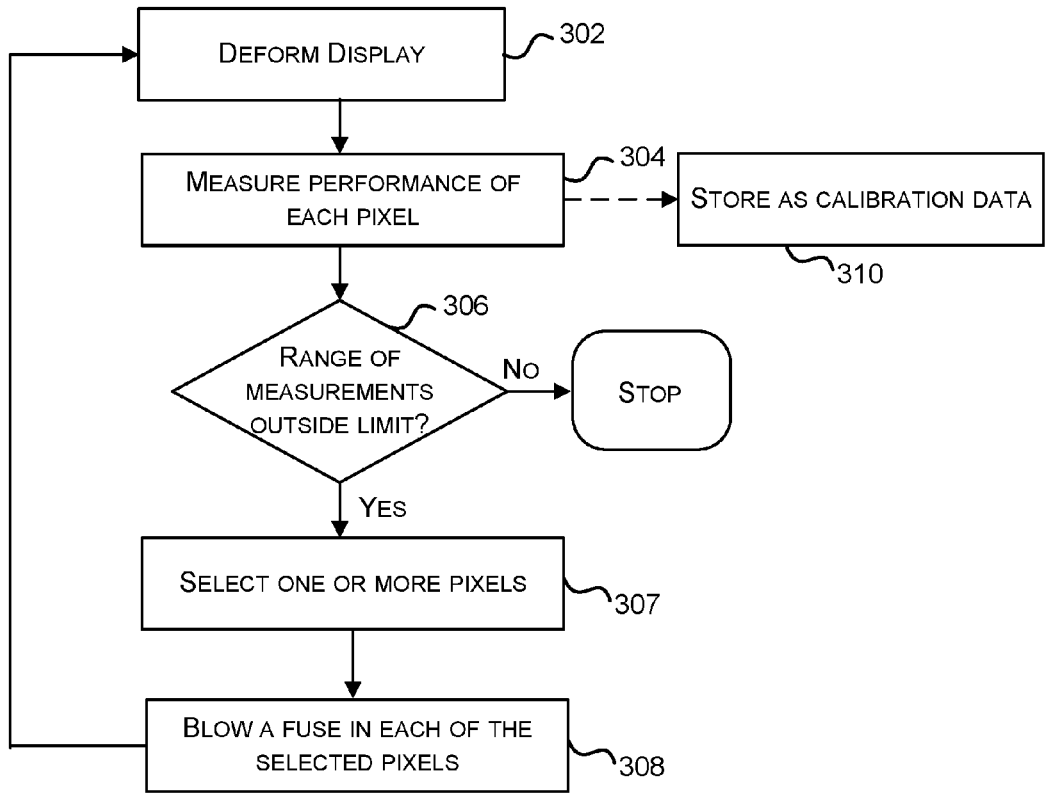
FIG. 3 is a flow diagram of an example method of setting up a display such as shown in FIG. 1 following deformation of the display.

The method shown in FIG. 3 may also be used in autonomous pixels that do not comprise fuses but where instead it is possible to intentionally induce failure in the transistors (e.g. by sending too much current through a terminal) and/or to destroy a part of the active area of the sensing element 105 (e.g. using a laser). In such an example, the method of FIG. 3 may proceed as described above but instead of blowing a fuse (in block 308) if the measured range in performance across the autonomous pixels 102 in a display exceeds a pre-defined limit ('Yes' in block 306), a transistor in a selected pixel is blown or a part of the sensing element in a selected pixel is destroyed.

In another variation on the method of FIG. 3, transistors may be selectively disabled using a plurality of global signal lines, with the first transistor in each pixel connected to a first global disable or enable line, the second transistor in each pixel connected to a second global disable or enable line, etc. By turning on each transistor line in order, it can be determined which transistors are operational or malfunctioning or broken and then one or more transistors can be selectively disabled (e.g. by inducing failure in the transistor), e.g. using the method of FIG. 3, but disabling transistors, rather than blowing fuses, in block 308.

In a further variation on FIG. 3, instead of blowing fuses, transistors may be laser trimmed (e.g. in block 308) to bring the range of measurements into the pre-defined limit.

As described above, instead of using fuses or destroying parts of the sensing elements, any difference in performance between autonomous pixels 102 in a display which results from some pixels 102 having transistors which have failed and other pixels 102 having no transistors that have failed can be removed through calibration. In such examples, the variation between autonomous pixels 102 may be measured after deformation (as in block 304 of FIG. 3) and then the measurements, or values derived from the measurements, may be stored as calibration data (block 310) and used when rendering images or other content to the display. The calibration data may, for example, be stored as a calibration map which shows the relative performance of the different autonomous pixels 102 in a display e.g. in the form of calibration factors to be applied. In various examples the calibration data may be stored on a central server (e.g. in a data center) and this may be accessed by a user device whenever it is to render new content to the display or it may be accessed once (e.g. when configuring a user device to be able to provide content to the particular display) and then stored on the user device.

In other examples, calibration may be performed each time that the display is updated (e.g. each time that an external stimulus is applied to the display or an update is triggered) and such techniques are described below.

Figure 4:
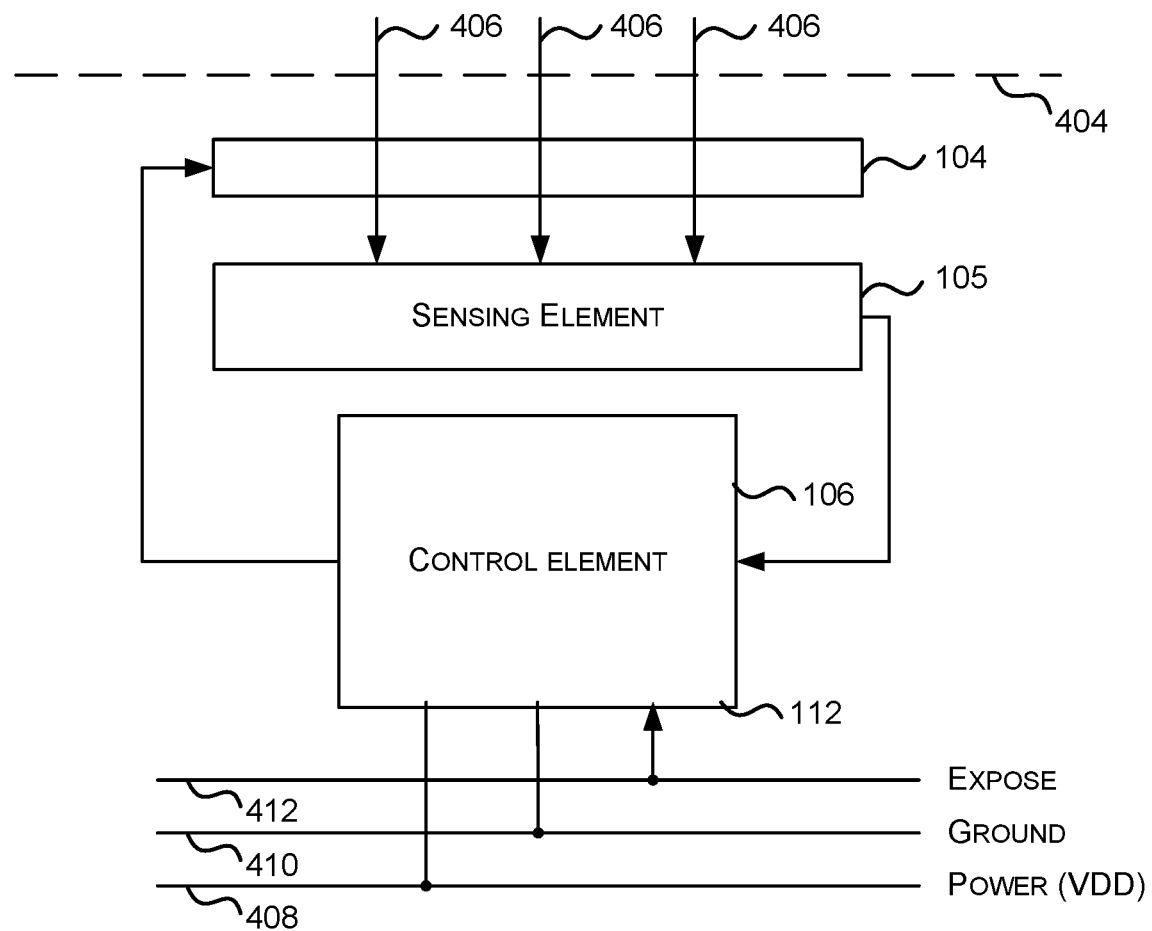
FIG. 4 shows two schematic diagrams of an autonomous pixel such as shown in FIG. 1.

FIG. 4 shows a schematic diagram of an autonomous pixel 102 in which the sensing element 105 and control element 106 are layered behind the display element 104 (the "front" surface of the display, which is the side viewed by the user, is indicated by the dotted line 204). The arrangement shown in FIG. 4 (which may be described as a 'vertical stack') relies upon the display element 104 being transparent to the external stimulus 406, so that the stimulus can be detected by the sensing element 105, and enables pixels to be very closely packed together (e.g. because the electronics in each pixel only occupies the area behind the display element). As described above, in other examples the display element 104 may be adjacent to the sensing element 105 or the control element 106. As shown in FIG. 4, the display may comprise one or more global connections (e.g. a global power rail or plane 408 and a global ground rail or plane 410) to which all the pixels 102 in a display and in the arrangement shown, each pixel connects to each rail or plane from above, e.g. using electrical vias.

By generating control signals locally and only providing global connections to each pixel (e.g. power lines 408, 410 which in the example shown are power and ground) it is not necessary to route signals to individual pixels. By using the vertical stack configuration shown in FIG. 4 it is also not necessary to route signals between pixels. Both of these aspects enable pixels to be densely packed together within a display and the use of global connections (e.g. instead of row/column connections) additionally enables displays with uniform pixel density to be formed on non-developable surfaces.

FIG. 4 also shows a third, optional, global signal 412 which may be referred to as an 'expose' or 'trigger' signal. This provides a single, common control signal for all pixels 102 in the display which determines the time when each pixel in the display senses the external stimulus (which may also be described as a local stimulus as it is detected separately within each pixel) and uses this information to display a new image pixel, i.e. the expose signal 412 can be used to synchronize (in time) the operation of all the autonomous pixels 102 within a display (and where this may be synchronized with the source of the external stimulus). A global expose signal may, for example, be used to reduce flicker (so that all pixels are updated at the same time) and/or reduce power consumption (so that all pixels update at defined points in time). This can be described with reference to the flow diagram in FIG. 5. The global expose signal may additionally be used to set an exposure level (e.g. for use in thresholding, as described above).

As described above, each pixel 102 detects an external stimulus at the pixel (block 502, e.g. in sensing element 105) and generates a control signal based on the detected stimulus (block 504, e.g. in pixel controller 112). The display element 104 is then updated based on the control signal (block 506), although as will be appreciated, depending on the control signal and the current state of the display element 104, updating the display element (in block 506) may not necessarily result in a change to the display element (e.g. for a bi-stable element which is currently black it may remain black or it may switch to white depending upon the control signal generated).

The global trigger signal 412 may be generated externally to any of the pixels in the display (for example, as is the case for the global power lines 408, 410 which may, for example, be generated by a discrete power supply within the display). Alternatively, the global trigger signal 412 may be generated by one of the autonomous pixels 102 in the display and used by the other autonomous pixels 102 in the display. In such an example, the autonomous pixel 102 which generates the global trigger signal 412 may generate the trigger signal in response to sensing an 'expose' stimulus or in response to a different trigger mechanism. In various examples, more than one or all of the autonomous pixels in the display may be capable of generating the global trigger signal 412 in response to detecting a trigger signal.

In the absence of a global trigger signal, each autonomous pixel 102 in a display may operate independently and different pixels may be updated (in block 506) at different times. However, where a global trigger signal is used (as detected in block 508), each autonomous pixel 102 still operates independently; however the operation of all the pixels in the display is synchronized in time because the update to display (in block 506, arrow (a)), the generation of the control signal (in block 304, arrow (b)) or the sensing (in block 502, arrow (c)) occurs in response to the detection of a trigger signal (in block 508) and all pixels are connected to the same trigger signal 412. Use of a global trigger signal may, for example, enable an image to be rendered onto a display using a single enable bit.

In another example, instead of using a global trigger signal, pixels may be configured to automatically trigger on power-on and in this example, each autonomous pixel may operate independently but in synchronization.

As described above, calibration may be performed each time that the display is updated, e.g. each time that an external stimulus is applied to the display (after block 502) or each time an update is triggered (after block 508). In various examples, the calibration may be implemented external to the display and involve a live closed loop. In such examples, a sensor (e.g. a camera or single pixel sensor) is linked to the source of the external stimulus and this monitors the visual change to the display (and to individual autonomous pixels 102 within the display) for an applied external stimulus. This may be used in a number of different ways.

In a first example which can be described with reference to FIG. 6, the sensor is used to control the amount of external stimulus applied when updating the display by applying the external stimulus (block 604) until the desired content is observed visually by the camera (block 606) and where the match between the actual change and the desired content (referred to in FIG. 6 as the target) is determined using image analysis hardware or software connected to the sensor (block 608). If the actual change does not match the target ('No' in block 608), the external stimulus may be applied again (block 604) and the method repeated. This method may be performed substantially in parallel for all of the autonomous pixels 102 in a display or for a subset of those pixels (e.g. one pixel at a time) and the external stimulus which is applied (in block 604) may be different for different pixels 102 in the display. The process stops when the update has been successfully applied to all of the pixels 102 in the display.

In a second example which can be described with reference to FIG. 6, the sensor is used as part of a specific calibration process and then the calibration data obtained from the calibration process may be used to render new content to the display. In such an example, the visual change to a pixel is measured (in block 606) for a defined applied external stimulus (as applied in block 604) and this may be used to generate a calibration factor. Alternatively, the external stimulus that is required to achieve a pre-defined change in the display may be measured, such as to turn each pixel from black to white. In this example, the external stimulus may be applied gradually to each pixel in the display (in block 604) and the point when the reaches its extreme color (e.g. white from black) is recorded (in block 606) and used to generate a calibration factor. The calibration process stops when all of the pixels in the display have reached their extreme color.

FIG. 7 shows a schematic diagram of another autonomous pixel 102 comprising a display element 104 and a control element 106; however, unlike the examples shown in FIGS. 1 and 4 described above, the autonomous pixel 102 shown in FIG. 7 comprises two different sensing elements 105A, 105B. The autonomous pixel also comprises two global electrical connections: a global power plane 408 (connected to the control element 106) and a global ground plane 410 (connected to both of the sensors 105A, 105B). The two sensors 105A, 105B are arranged to detect different external stimuli and the control element 106 is arranged to generate a control signal to drive the display element 104 based on input signals received from both of the sensors.

The control element 106 comprises separate amplification circuits (e.g. within the pixel driver 110) for each sensing element 105A, 105B and each amplification circuit comprises a plurality of transistors (as described above) and these transistors are grouped at least in pairs, with transistors within a group being connected in parallel to provide redundancy in the event of failure of one (or more) of the transistors within a group. Furthermore, the transistors within a group are oriented in at least two different orientations (e.g. within the plane of the display, prior to deformation) and/or spatially separated such that the effect of any deformation on the transistors within a group is not likely to be identical. In addition, in the example shown in FIG. 7, the first transistor in a group associated with the first sensing element 105A is always physically close to the first transistor in a group associated with the second sensing element 105B so that both first transistors are likely to experience similar forces on deformation and be affected in the same way. Similarly, the second transistor in a group associated with the first sensing element 105A is always physically close to the second transistor in a group associated with the second sensing element 105B so that both second transistors are likely to experience similar forces on deformation and be affected in the same way.

The first sensor 105A generates a signal in response to detection of a first external stimulus and the resultant state of the display element 104 is dependent upon the detected level of the first external stimulus. Exactly how the detected level of the first external stimulus is mapped to a state of the display element 104 depends upon a detected level of the second external stimulus by the second sensor 105B which is used for calibration purposes.

Figure 7:
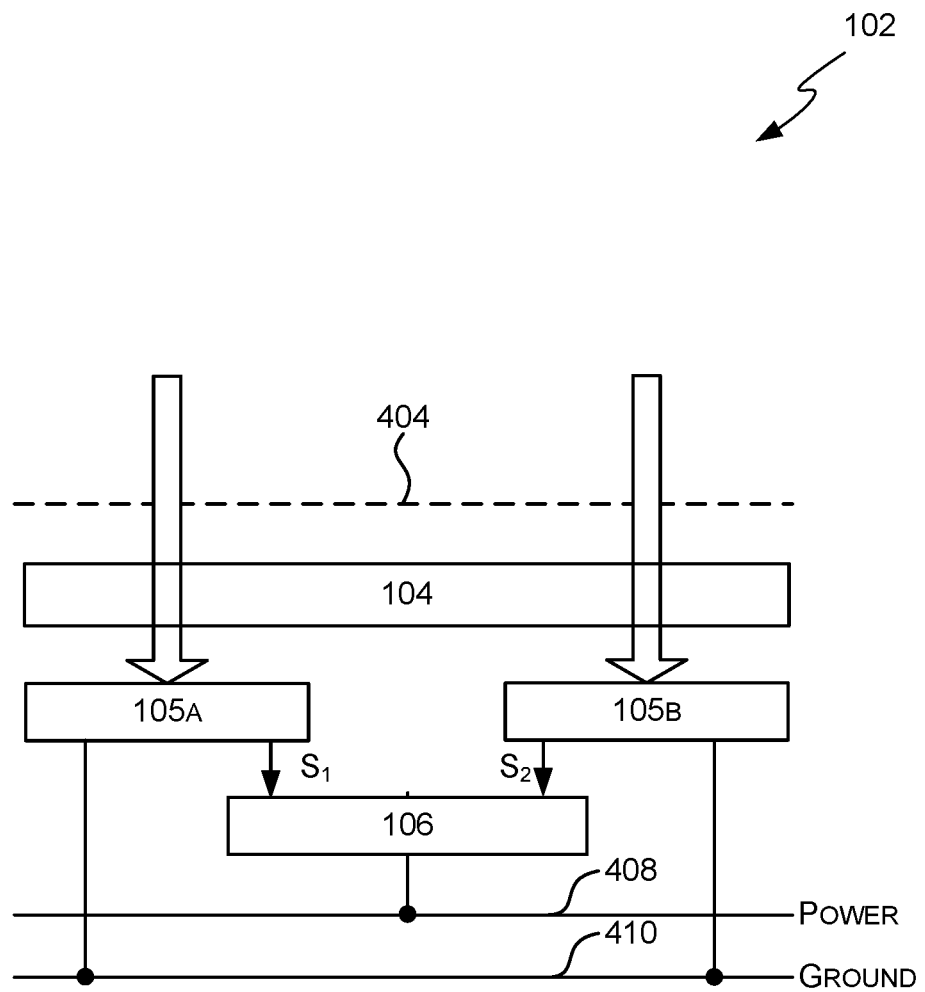
FIG. 7 is a schematic diagram of a further example autonomous pixel.

In the autonomous pixel 102 shown in FIG. 7, the signal, $S_1$, generated by the first sensor 105A may be described as providing "image data" and the signal, $S_2$, generated by the second sensor may be described as providing "control data", where this control data provides data to set the sensitivity of the pixel (e.g. by setting a threshold) and may also be used for other functionality, e.g. to specify when a pixel is updated (e.g. in the form of an expose signal received via an external stimulus rather than a global control plane), to provide data which is used to reject background (or ambient) levels of an external stimulus, to provide data to switch between writing and erasing modes, to provide data to selectively enable writing to the pixel, etc. Where the "control data" is used for other functionality (in addition to calibration), it may replace the expose plane 412 or another global control plane.

An example method of operation of the control element 106 in FIG. 7 can be described with reference to the flow diagram in FIG. 8. The second sensor 105B generates a signal, $S_2$, in response to detection of a second external stimulus and this signal, which is input to the control element 106 (in block 802), defines a threshold, $T_2$ (block 804) which is used within the control element 106 to calibrate the pixel as it determines the state that the display element 104 should be driven to and hence to determine the control signal which is generated. If any of the transistors in the group(s) of transistors in the amplification circuit (within the control element 106) for the second sensor 105B has failed or been significantly degraded, then the value of $T_2$ will be set lower than if all the transistors are working correctly. Then, when rendering content to the display using the first external stimulus, if the signal, $S_1$, input to the control element 106 from the first sensor 105A has a level (or magnitude) which exceeds $T_2$ ('Yes' in block 806) then a control signal is generated to drive the display element 104 to a first state (block 808) and if the signal input to the control element 106 from the first sensor 105A has a level (or magnitude) which does not exceed $T_2$ ('No' in block 806), then a control signal is generated to drive the display element 104 to a second state which is not the same as the first state (block 810) or alternatively, no control signal may be generated (block 812) and the pixel may not be updated. The threshold value, $T_2$ (generated in block 804) may be referred to as a calibration factor or parameter.

Figure 8:
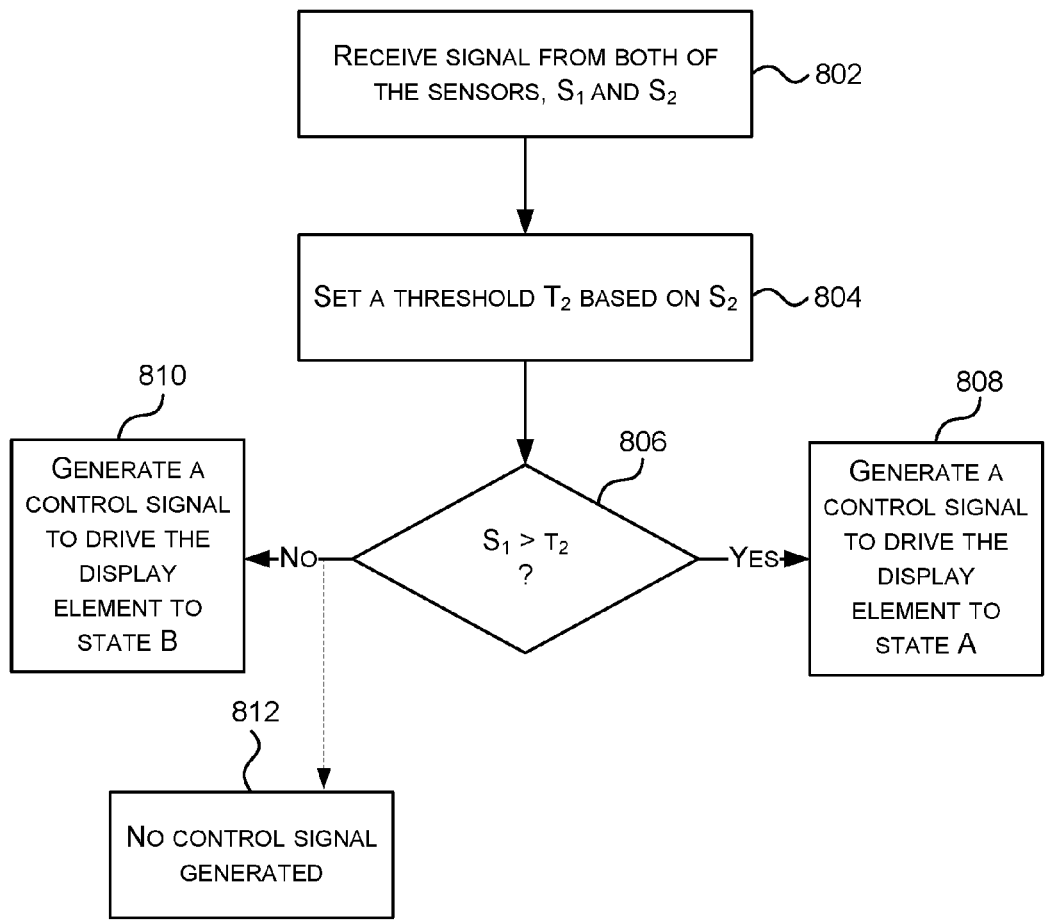
FIG. 8 is a flow diagram showing other example methods of operation of an autonomous pixel such as the one shown in FIG. 7.

In the method shown in FIG. 8, a separate global expose signal may also be provided in order that all the pixels in the display update at the same time and this global expose signal may, for example, be provided via a global expose plane 412 or there may be a third sensor in each pixel which is responsive to a third external stimulus which provides a global expose signal. In other examples, however, the update may be triggered whenever $S_1$ exceeds $T_2$ ('Yes' in block 806).

Figure 9:
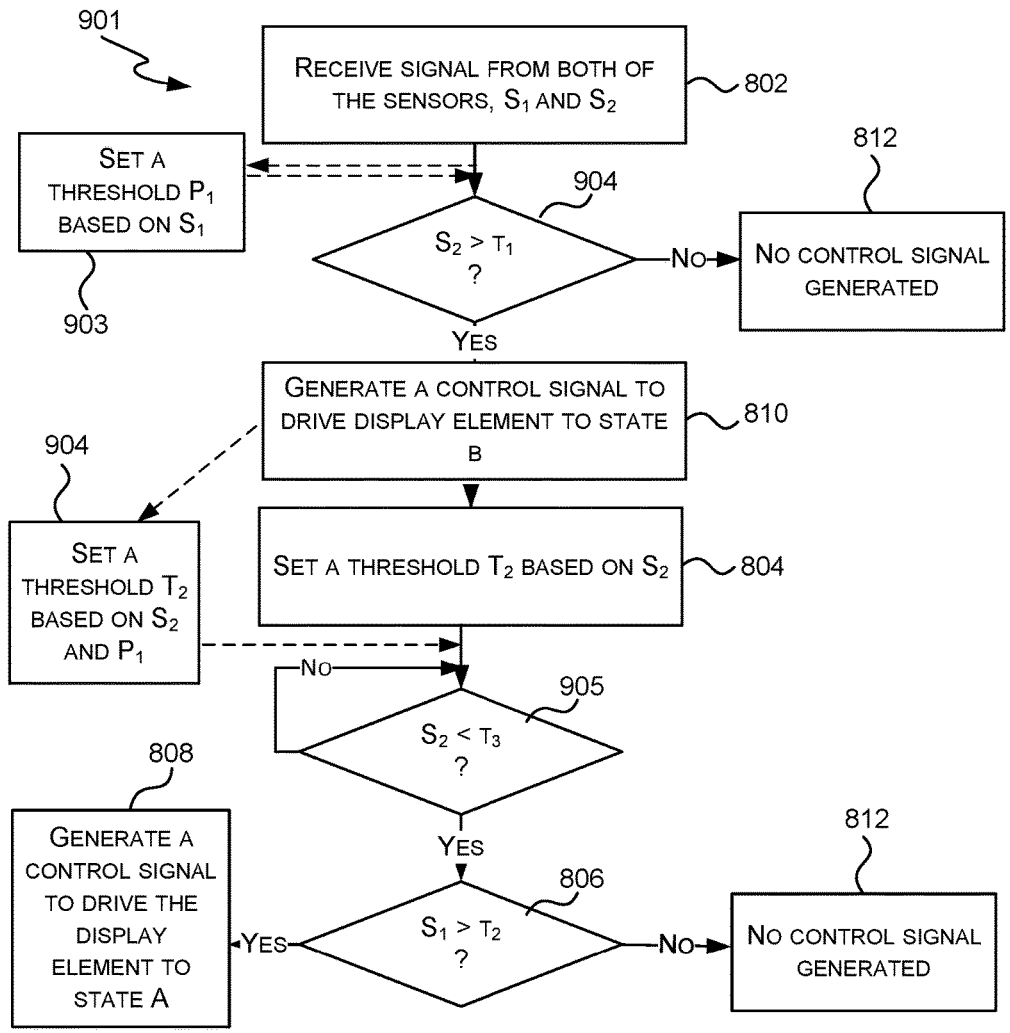
FIG. 9 shows a flow diagram showing further example methods of operation of an autonomous pixel such as the one shown in FIG. 7 and a graph showing the level of the second sensor signal level during the method.
Figure 9:
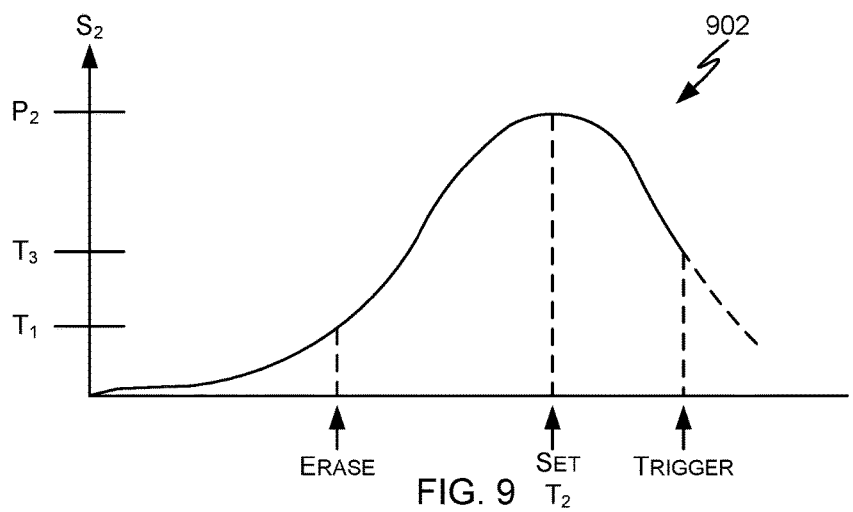

A variation on the method of FIG. 8 is shown in FIG. 9 and in this example, the second external stimulus (which provides the control data) is used to perform three functions: to erase the pixel (i.e. to drive the display element 104 to state B), to set a threshold, $T_2$, and to provide the expose signal.

As shown in the flow diagram 901 and graph 902 (which shows the magnitude of $S_2$) in FIG. 9, the control element receives signals from both of the sensors (block 802) and when the detected level of the second external stimulus exceeds a threshold value, $T_1$, ('Yes' in block 904), a control signal is generated to drive the display element 104 to its erased or default state, state B (block 810). A peak value of $S_2$ (labeled $P_2$) is then used to set a threshold, $T_2$ (block 804). When the value of $S_2$ subsequently falls below a further threshold, $T_3$ ('Yes' in block 905) the pixel enters a state when it is ready to expose and if the signal, $S_1$, input to the control element 106 from the first sensor 105A has a level (or magnitude) which exceeds $T_2$ ('Yes' in block 806) a control signal is generated to drive the display element 104 to the written state, state A (block 808).

The flow diagram 901 in FIG. 9 also shows a variation on the method described above (as indicated by the dotted arrows) in which the sensitivity and background rejection levels are set independently using the second external stimulus. In this variation, in a period of time before the detected level of the second external stimulus exceeds the threshold value, $T_1$, ('Yes' in block 904), a parameter, $P_1$, is generated based on the signal, $S_1$, received from the first sensor 106 (block 903). This parameter, $P_1$, is a measure of the background level of the first external stimulus. Subsequently, both $S_2$ and $P_1$ are used to generate the threshold, $T_2$, (block 904).

Although the methods of FIGS. 8 and 9 have been described above in relation to a display element 104 which has two possible states (e.g. black and white), the methods may also be used where a display element has more than two possible states (e.g. for a greyscale or color display) and in such examples, multiple thresholds may be set based on $S_2$ (or $S_2$ and $P_1$) and then dependent upon the value of $S_1$ compared to each of the thresholds, different control signals may be generated. For example, based on $S_2$ and optionally $P_1$, two thresholds may be set $T_{2-1}$ and $T_{2-2}$ where $T_{2-1} < T_{2-2}$ (in block 804 or 904). If $S_1$ does not exceed $T_{2-1}$ then no control signal may be generated (block 812), so that the display element 104 remains in its erased state (e.g. black). If $S_1$ exceeds $T_{2-2}$ then a control signal may be generated (block 808), so that the display element 104 changes to a one state (e.g. white). If $T_{2-1} < S_1 < T_{2-2}$ then a control signal may be generated (block 808), so that the display element 104 changes to a different, intermediate, state (e.g. grey). If the display element 104 has more possible intermediate states (e.g. multiple grey levels) then more than two thresholds may be generated (in block 804 or 904). In examples with more than two states (e.g. examples with one or more intermediate states such that more than one threshold is set), the benefits associated separate determination of the sensitivity and background rejection level may be increased.

Figure 10:
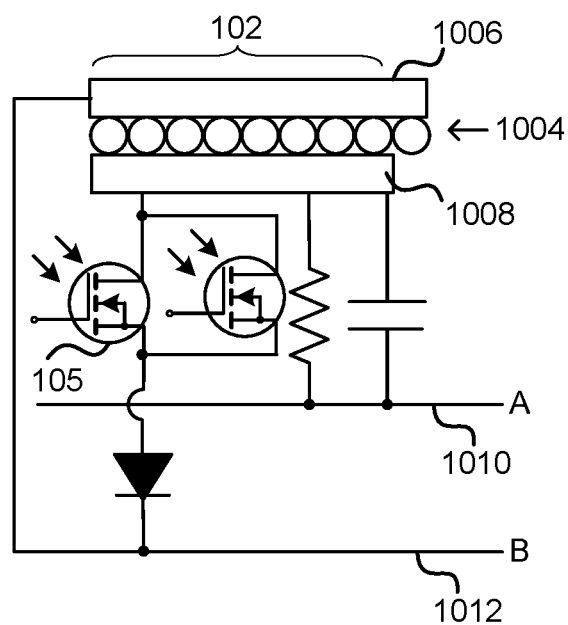
FIG. 10 is another example circuit diagram showing a portion of the control element within an autonomous pixel.

In the examples described above, it is the transistors within an autonomous pixel that are replicated. However, in other examples, the sensing element 105 may be replicated (e.g. where the sensing element 105 is integrated into the transistor) and again these may be connected in parallel and an example circuit diagram is shown in FIG. 10. In a further variation (not shown in FIG. 10), the two sensing elements 105 may be connected to a single transistor and in this case, it may be possible to blow (i.e. deactivate) the sensors or the connections into the transistor from the sensors (e.g. in an equivalent to the method of FIG. 3). The two sensing elements 105 may be oriented in two different orientations and/or spatially separated, although where they are spatially separated, the two sensing elements 105 are still closer to the display element 104 in the same autonomous pixel 102 than to display elements in neighboring autonomous pixels, so that the applied external stimulus will be similar, if not the same, at each sensing element 105. As with the transistor examples, a group of sensor devices within a pixel may comprise more than two sensor devices.

In examples where the sensing element 105 is replicated, fuses (or antifuses) or other means (such as one or more laser trimmable transistors) may also be included to enable the variability between pixels to be reduced (e.g. where this variability is a consequence of some pixels having only a proper subset of the sensing elements 105 operating properly) or the variation may be calibrated out (e.g. using methods similar to those described above with reference to FIG. 3).

The example shown in FIG. 10 uses a multi-stable display element which comprises a portion of an electrophoretic film 1004 (which may be continuous across many autonomous pixels 102, e.g. across all the pixels in a display) between a portion of a common electrode 1006 and a discrete electrode 1008 (one per pixel). In the example shown, the common electrode 1006 is in front of the electrophoretic film 1004 (i.e. between the film 1004 and the front face of the display) and is therefore transparent. The discrete electrode 1008 is behind the film 1004 (i.e. on the other side of the film to the common electrode 1006) and is sufficiently transparent to enable the visible light to be incident upon the transistors which are the duplicated sensing elements 105. Each pixel 102 is connected to two global power lines 1010, 1012 denoted A and B respectively where one of these power lines (global power line B, 1012) is also connected to the common electrode 1006 adjacent to the electrophoretic file 1004. There is no separate 'enable' line in this example, but as the display is multi-stable, updating of the display can be triggered, for all pixels at the same time, by reversing the voltages of the two global power lines 1010, 1012.

In addition to replicating transistors, the connections to the single sensing element 105 may also be replicated (i.e. to provide multiple connections to the sensing element 105 at different locations) to make the circuit more robust against fractures to a single wire.

Although the examples described above show a single display element 104 in each pixel (where this display element may comprise a discrete element or be part of a larger film or layer of display material) such that there is a 1:1 relationship between pixels and display elements 104, in various examples, there may be more than one display element 104 in a pixel and the state of all the display elements 104 may be controlled together based on the output of the single sensing element (within the control element 106).

In the examples described above each pixel operates autonomously, such that the state (e.g. color) of a display element is affected only by the external stimulus detected by the sensing element 105 in that particular pixel and any processing performed on the output of the sensing element in the control element 106 in the pixel. There is no influence of one pixel on adjacent pixels (each one operates identically but independently) and control signals are therefore generated locally on a per-pixel basis (and so the identical operation may lead to different colors of the display elements).

In a variation on the examples described above, a pixel may be influenced by its neighbor pixels such that the control signal to drive the display element is based on the external stimulus sensed locally (i.e. within the pixel) and in addition also on the external stimulus sensed by one or more proximate pixels. For example, the control sample may be based on the external stimulus sensed locally and the external stimulus sensed by those pixels which are immediately adjacent to the particular pixel.

Although the present examples are described and illustrated herein as being implemented in a display as shown in FIG. 1 with circular pixels, the system described is provided as an example and not a limitation. As those skilled in the art will appreciate, the present examples are suitable for application in a variety of different types of display systems and different shaped pixels may be used (e.g. triangular, square, hexagonal or irregular shaped pixels such as where the pixels are arranged according to a Voronoi tessellation). The display system may be planar or curved and as described above may be a non-developable surface. Some displays may comprise a small number of pixels (e.g. tens of pixels) and other displays may comprise a very large number of pixels (e.g. from many thousands to many millions of pixels). In many examples the pixel size may be very small (e.g. such that the display has a resolution of 300 pixelsper-inch or more); however, in other examples, much larger pixel sizes (e.g. pixel diameters of several millimeters or centimeters) may be used.

Using the autonomous pixels described herein, displays may be fabricated with pixels in any arrangement and on surfaces of any complexity (as long as the manufacturing process can fabricate the signal and power stack onto it). In examples where random or pseudo-random pixel placement is used, the display will not suffer from moiré or other aliasing artifacts which standard rectilinear pixel arrangements experience.

The autonomous pixels described herein may be used to create displays of any size and shape and these displays may be used for any application. Example applications include, but are not limited to, displays on highly contoured or irregular surfaces (e.g. on the exterior of a vehicle or other object), displays on wearable devices, toys, game pieces or cards, etc.

Many different fabrication methods or techniques may be used to make a display comprising the autonomous pixels described herein including, but not limited to, roll-to-roll methods, laser cutting, vacuum forming, robot placement of pixels and spray placement of pixels.

Although in the examples described above, there is always a global power plane 408, in further examples, each pixel 102 may comprise a power harvesting element (which may for example be part of the control element 106) and in such examples the global power plane 408 may be omitted. In other examples where power harvesting is used, there may be no global electrical planes (e.g. where an expose or trigger signal may be provided through other means, such as optically).

A first further example provides a display comprising a plurality of autonomous pixels on a substrate, wherein each autonomous pixel comprises: a display element; a sensing element arranged to detect an external stimulus; and a control element arranged to generate, entirely within the autonomous pixel, a control signal to drive the display element based, at least in part, on a magnitude of the external stimulus detected by the sensing element and wherein the control element comprises one or more groups of transistors, each group comprising at least a first and a second transistor both arranged to perform the same function and connected in parallel with each other.

The substrate may be deformable.

Alternatively or in addition to any of the preceding examples the first transistor and the second transistor may be positioned in different orientations.

Alternatively or in addition to any of the preceding examples the first transistor and the second transistor may be spatially separated.

Alternatively or in addition to any of the preceding examples the display may further comprise a first fuse connected in series with the first transistor and a second fuse connected in series with the second transistor.

Alternatively or in addition to any of the preceding examples the sensing element may be a first sensing element arranged to detect a first external stimulus and the display may further comprise: a second sensing element arranged to detect a second external stimulus, and wherein the control element comprises one or more groups of transistors associated with each of the sensing elements, each group comprising at least a first and a second transistor, wherein the first and second transistors in a group are arranged to perform the same function and are connected in parallel with each other and wherein a first transistor in a group associated with the first sensing element is physically proximate to a first transistor in a group associated with the second sensing element.

Alternatively or in addition to any of the preceding examples the control element may be arranged to generate a threshold level based, at least in part, on a magnitude of the second external stimulus detected by the second sensing element and to generate a control signal to drive the display element based, at least in part, on both the magnitude of the first external stimulus detected by the first sensing element and the threshold level.

Alternatively or in addition to any of the preceding examples the control element may be arranged to generate a control signal to drive the display element to a first state in response the magnitude of the first external stimulus detected by the first sensing element exceeding the threshold level and to generate a control signal to drive the display element to a second state in response the magnitude of the first external stimulus detected by the first sensing element not exceeding the threshold level.

Alternatively or in addition to any of the preceding examples the threshold level may be a first threshold level and wherein the control element may be arranged to generate a control signal to drive the display element to a first state in response the magnitude of the second external stimulus detected by the second sensor exceeding a second, pre-defined, threshold level and subsequently, in response to the magnitude of the second external stimulus detected by the second sensor falling below a third, pre-defined, threshold level, to generate a control signal to drive the display element to a second state in response the magnitude of the first external stimulus detected by the first sensor exceeding the first threshold level.

A second further example provides a display comprising a plurality of autonomous pixels on a substrate, wherein each autonomous pixel comprises: a display element; means for detecting an external stimulus; and means for generating, entirely within the autonomous pixel, a control signal to drive the display element based, at least in part, on a detected magnitude of the external stimulus and wherein the means for generating the control signal comprises one or more groups of transistors, each group comprising at least a first and a second transistor both arranged to perform the same function and connected in parallel with each other.

In various examples, the means for detecting an external stimulus is a sensing element (or sensor) 105 as shown in FIG. 1 and described above. This may, for example, comprise one or more transistors.

In various examples, the means for generating a control signal may comprise a control element 106 as shown in FIG. 1 and this comprises two or more transistors (e.g. as shown in FIG. 2). In various examples, the means for generating a control signal may comprise a pixel driver 110 and/or pixel controller 112 as shown in FIG. 1.

A third further example provides a method of fabricating a display comprising a plurality of autonomous pixels, the method comprising: forming a plurality of autonomous pixels on a deformable substrate, wherein each autonomous pixel comprises a display element; a sensing element arranged to detect an external stimulus; and a control element arranged to generate, entirely within the autonomous pixel, a control signal to drive the display element based, at least in part, on a magnitude of the external stimulus detected by the sensing element and wherein the control element comprises one or more groups of transistors, each group comprising at least a first and a second transistor both arranged to perform the same function and connected in parallel with each other and further comprising a first fuse connected in series with the first transistor and a second fuse connected in series with the second transistor; and after the display has been deformed: (i) measuring characteristics of each pixel in the display; and (ii) in response to determining that the characteristics for at least a subset of the pixels in the display exceed a pre-defined range, selecting a pixel in the display based on the measured characteristics and blowing the first or second fuse in the selected pixel.

This method may be implemented by one or more devices (e.g. as part of a manufacturing line).

In various examples, the at least a subset of the pixels comprises all the pixels in the display.

The method may further comprise: repeating (i) and (ii) until the characteristics for all of the pixels in the display are within a pre-defined range or a second criterion is satisfied. The second criterion may define a maximum number of fuses that can be blown.

A fourth further example provides a method of operating a display comprising a plurality of autonomous pixels on a substrate, wherein each autonomous pixel comprises: a display element; a sensing element arranged to detect an external stimulus; and a control element arranged to generate, entirely within the autonomous pixel, a control signal to drive the display element based, at least in part, on a magnitude of the external stimulus detected by the sensing element and wherein the control element comprises one or more groups of transistors, each group comprising at least a first and a second transistor both arranged to perform the same function and connected in parallel with each other and wherein the method comprises: applying an external stimulus; observing a visual change in the display using a camera; and comparing the observed change to a target change.

The substrate may be deformable.

Alternatively or in addition to any of the preceding examples the method may further comprise: in response to determining that the observed change does not match the target change, repeating the application of the external stimulus until the observed change matches the target change.

Alternatively or in addition to any of the preceding examples the target change may be a change of the display element from one extreme state to another extreme state and wherein the method further comprises: storing a calibration parameter for each autonomous pixel, wherein the calibration parameter is based, at least in part, on an amount of external stimulus applied when the observed change matched the target change for that autonomous pixel.

A fifth further example provides a method of operating a display comprising a plurality of autonomous pixels on a substrate, wherein each autonomous pixel comprises: a display element; a first sensing element arranged to detect a first external stimulus; a second sensing element arranged to detect a second external stimulus; and a control element comprising one or more groups of transistors, each group comprising at least a first and a second transistor both arranged to perform the same function and connected in parallel with each other and wherein the method comprises: generating, in the control element, a first threshold level based, at least in part, on a magnitude of the second external stimulus detected by the second sensor; and generating, in the control element, a control signal to drive the display element to a first state in response the magnitude of the first external stimulus detected by the first sensor exceeding the first threshold level; and generating, in the control element, a control signal to drive the display element to a second state in response the magnitude of the first external stimulus detected by the first sensor not exceeding the first threshold level.

The substrate may be deformable.

A sixth further example provides a display comprising a plurality of autonomous pixels on a substrate, wherein each autonomous pixel comprises: a display element; a first sensing element and a second sensing element, both arranged to detect the same external stimulus and connected in parallel with each other; a control element arranged to generate, entirely within the autonomous pixel, a control signal to drive the display element based, at least in part, on a magnitude of the external stimulus detected by the first and second sensing elements.

The substrate may be deformable.

Alternatively or in addition to any of the preceding examples the first sensing element and the second sensing element may have different orientations.

The term 'computer' or 'computing-based device' is used herein to refer to any device with processing capability such that it can execute instructions. Those skilled in the art will realize that such processing capabilities are incorporated into many different devices and therefore the terms 'computer' and 'computing-based device' each include PCs, servers, mobile telephones (including smart phones), tablet computers, set-top boxes, media players, games consoles, personal digital assistants and many other devices.

The methods described herein may be performed by software in machine readable form on a tangible storage medium e.g. in the form of a computer program comprising computer program code means adapted to perform all the steps of any of the methods described herein when the program is run on a computer and where the computer program may be embodied on a computer readable medium. Examples of tangible storage media include computer storage devices comprising computer-readable media such as disks, thumb drives, memory etc. and do not include propagated signals. Propagated signals per se are not examples of tangible storage media. The software can be suitable for execution on a parallel processor or a serial processor such that the method steps may be carried out in any suitable order, or simultaneously.

This acknowledges that software can be a valuable, separately tradable commodity. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

Any range or device value given herein may be extended or altered without losing the effect sought, as will be apparent to the skilled person.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the examples described above may be combined with aspects of any of the other examples described to form further examples without losing the effect sought.

The term 'comprising' is used herein to mean including the method blocks or elements identified, but that such blocks or elements do not comprise an exclusive list and a method or apparatus may contain additional blocks or elements.

The term 'subset' is used herein to refer to a proper subset such that a subset of a set does not comprise all the elements of the set (i.e. at least one of the elements of the set is missing from the subset).

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. A display comprising a plurality of autonomous pixels on a substrate, wherein each autonomous pixel comprises:
   a display element;
   a first sensing element arranged to detect a first external stimulus;
   a second sensing element arranged to detect a second external stimulus, wherein the first external stimulus and the second external stimulus comprise ambient signals incident upon a sensor device or an applied signal or stimulus applied in a region of the autonomous pixel; and
   a control element arranged to:
      generate, within the autonomous pixel, a control signal to drive the display element based, at least in part, on a magnitude of the first external stimulus detected by the first sensing element and a first threshold level, the first threshold level generated based at least in part on a magnitude of the second external stimulus detected by the second sensing element, wherein the control element comprises one or more groups of transistors associated with each of the sensing elements, each group comprising at least a first and a second transistor both arranged to perform the same function and connected in parallel with each other, wherein a first transistor in a group associated with the first sensing element is physically proximate to a first transistor in a group associated with the second sensing element;
      generate a control signal to drive the display element to a first state based on the magnitude of the second external stimulus exceeding a second predefined threshold level; and
      subsequently, generate a control signal to drive the display element to a second state based on the magnitude of the second external stimulus falling below a third predefined threshold level, and based on the magnitude of the first external stimulus exceeding the first threshold level.

2. A display according to claim 1, further comprising a first fuse connected in series with the first transistor and a second fuse connected in series with the second transistor.

3. A display according to claim 2, further comprising selectively disabling the first fuse connected in series with the first transistor and selectively disabling the second fuse connected in series with the second transistor.

4. A display according to claim 1, wherein the substrate is deformable.

5. A display according to claim 1, wherein the first transistor and the second transistor have different orientations.

6. A display according to claim 1, wherein the first transistor and the second transistor are spatially separated.

7. A display according to claim 1, wherein the control element is arranged to generate a control signal to drive the display element to a third state in response to the magnitude of the first external stimulus detected by the first sensing element exceeding the first threshold level and to generate a control signal to drive the display element to a fourth state in response to the magnitude of the first external stimulus detected by the first sensing element not exceeding the first threshold level.

8. A method of fabricating a display comprising a plurality of autonomous pixels, the method comprising:
   forming a plurality of autonomous pixels on a deformable substrate, wherein each autonomous pixel comprises a display element; a first sensing element arranged to detect a first external stimulus; a second sensing element arranged to detect a second external stimulus, wherein the first external stimulus and the second external stimulus comprise ambient signals incident upon a sensor device or an applied signal or stimulus applied in a region of the autonomous pixel; and a control element arranged to:
   generate, within the autonomous pixel, a control signal to drive the display element based, at least in part, on a magnitude of the first external stimulus detected by the first sensing element and a first threshold level, the first threshold level generated based at least in part on a magnitude of the second external stimulus detected by the second sensing element, wherein the control element comprises one or more groups of transistors associated with each of the sensing elements, each group comprising at least a first and a second transistor both arranged to perform the same function and connected in parallel with each other, wherein a first transistor in a group associated with the first sensing element is physically proximate to a first transistor in a group associated with the second sensing element;

generate a control signal to drive the display element to a first state based on the magnitude of the second external stimulus exceeding a second predefined threshold level; and subsequently, generate a control signal to drive the display element to a second state based on the magnitude of the second external stimulus falling below a third predefined threshold level, and based on the magnitude of the first external stimulus exceeding the first threshold level; and after the display has been deformed:
(i) measuring characteristics of each pixel in the display; and
(ii) in response to determining that the characteristics for at least a subset of the pixels in the display exceed a pre-defined range, selecting a pixel in the display based on the measured characteristics and selectively disabling the first or second transistor in the selected pixel.

9. A method according to claim 8, further comprising:
repeating (i) and (ii) until the characteristics for all of the pixels in the display are within a pre-defined range.

10. A method according to claim 8, further comprising a first fuse connected in series with the first transistor and a second fuse connected in series with the second transistor and wherein selectively disabling the first or second transistor in the selected pixel comprises:
blowing the first or second fuse in the selected pixel.

11. A method according to claim 8, further comprising:
repeating (i) and (ii) until the characteristics for all of the pixels in the display satisfy a second criterion.

12. A method according to claim 11, wherein the second criterion defines a maximum number of fuses that can be blown.

13. A method according to claim 8, wherein selectively disabling the first or second transistor in the selected pixel comprises:
inducing failure in the first or second transistor in the selected pixel.

14. A display according to claim 8, wherein the first transistor and the second transistor have different orientations.

15. A display according to claim 8, wherein the first transistor and the second transistor are spatially separated.

16. A display according to claim 8, further comprising a first fuse connected in series with the first transistor and a second fuse connected in series with the second transistor.

17. A method of operating a display comprising a plurality of autonomous pixels on a substrate, wherein each autonomous pixel comprises: a display element; a first sensing element arranged to detect a first external stimulus; a second sensing element arranged to detect a second external stimulus, wherein the first external stimulus and the second external stimulus comprise ambient signals incident upon a sensor device or an applied signal or stimulus applied in a region of the autonomous pixel; and a control element arranged to:

generate, within the autonomous pixel, a control signal to drive the display element based, at least in part, on a magnitude of the first external stimulus detected by the first sensing element and a first threshold level, the first threshold level generated based at least in part on a magnitude of the second external stimulus detected by the second sensing element, wherein the control element comprises one or more groups of transistors associated with each of the sensing elements, each group comprising at least a first and a second transistor both arranged to perform the same function and connected in parallel with each other, wherein a first transistor in a group associated with the first sensing element is physically proximate to a first transistor in a group associated with the second sensing element:

generate a control signal to drive the display element to a first state based on the magnitude of the second external stimulus exceeding a second predefined threshold level; and subsequently generate a control signal to drive the display element to a second state based on the magnitude of the second external stimulus falling below a third predefined threshold level, and based on the magnitude of the first external stimulus exceeding the first threshold level;

and wherein the method comprises:
applying a third external stimulus; observing a visual change in the display using a camera; and comparing the observed change to a target change.

18. A method according to claim 17, further comprising:
in response to determining that the observed change does not match the target change, repeating the application of the third external stimulus until the observed change matches the target change.

19. A method according to claim 18, wherein the target change is a change of the display element from one extreme state to another extreme state and wherein the method further comprises:
storing a calibration parameter for each autonomous pixel, wherein the calibration parameter is based, at least in part, on an amount of the third external stimulus applied when the observed change matched the target change for that autonomous pixel.

20. A method according to claim 17, wherein the substrate is deformable.

* * * * *